(12) United States Patent
Orner et al.

(10) Patent No.: US 7,691,734 B2
(45) Date of Patent: Apr. 6, 2010

(54) DEEP TRENCH BASED FAR SUBCOLLECTOR REACHTHROUGH

(75) Inventors: Bradley A. Orner, Fairfax, VT (US); Robert M. Rassel, Colchester, VT (US); David C. Sheridan, Starkville, MS (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 11/680,637

(22) Filed: Mar. 1, 2007

(65) Prior Publication Data

US 2008/0211064 A1 Sep. 4, 2008

(51) Int. Cl.
*H01L 21/04* (2006.01)

(52) U.S. Cl. ........................ 438/510; 438/76; 438/146; 438/175; 438/262; 438/282; 438/370; 438/766; 438/526; 257/216; 257/349; 257/219; 257/E21.339; 257/E21.537; 257/E21.563; 257/E21.63; 257/E29.27

(58) Field of Classification Search ................. 438/510, 438/420, 76, 146, 244, 262, 282, 370, 376, 438/766, 525, FOR. 257; 257/550, 497, 257/498, 361, 362, E29.332
See application file for complete search history.

(56) References Cited

U.S. PATENT DOCUMENTS

| | | | | |
|---|---|---|---|---|
| 3,386,865 A | * | 6/1968 | Doo | 438/353 |
| 3,648,125 A | * | 3/1972 | Peltzer | 257/515 |
| 3,841,917 A | * | 10/1974 | Shannon | 438/186 |
| 3,947,299 A | * | 3/1976 | Weijland et al. | 438/442 |
| 4,236,294 A | | 12/1980 | Anantha et al. | |
| 4,243,435 A | | 1/1981 | Barile et al. | |
| 4,272,776 A | * | 6/1981 | Weijland et al. | 257/511 |
| 4,353,086 A | * | 10/1982 | Jaccodine et al. | 257/301 |
| 4,466,180 A | * | 8/1984 | Soclof | 438/335 |
| 4,470,062 A | * | 9/1984 | Muramatsu | 257/513 |
| 4,503,451 A | * | 3/1985 | Lund et al. | 257/374 |
| 4,519,128 A | * | 5/1985 | Chesebro et al. | 438/433 |
| 4,528,047 A | * | 7/1985 | Beyer et al. | 438/429 |
| 4,546,538 A | * | 10/1985 | Suzuki | 438/426 |
| 4,549,927 A | * | 10/1985 | Goth et al. | 438/361 |
| 4,638,552 A | * | 1/1987 | Shimbo et al. | 438/455 |
| 4,672,410 A | * | 6/1987 | Miura et al. | 257/302 |
| 4,689,656 A | * | 8/1987 | Silvestri et al. | 257/513 |

(Continued)

*Primary Examiner*—Fernando L Toledo
*Assistant Examiner*—Ankush k Singal
(74) *Attorney, Agent, or Firm*—Scully, Scott, Murphy & Presser, P.C.; Richard M. Kotulak, Esq.

(57) ABSTRACT

A far subcollector, or a buried doped semiconductor layer located at a depth that exceeds the range of conventional ion implantation, is formed by ion implantation of dopants into a region of an initial semiconductor substrate followed by an epitaxial growth of semiconductor material. A reachthrough region to the far subcollector is formed by outdiffusing a dopant from a doped material layer deposited in the at least one deep trench that adjoins the far subcollector. The reachthrough region may be formed surrounding the at least one deep trench or only on one side of the at least one deep trench. If the inside of the at least one trench is electrically connected to the reachthrough region, a metal contact may be formed on the doped fill material within the at least one trench. If not, a metal contact is formed on a secondary reachthrough region that contacts the reachthrough region.

9 Claims, 17 Drawing Sheets

U.S. PATENT DOCUMENTS

| | | | | |
|---|---|---|---|---|
| 4,704,368 A | * | 11/1987 | Goth et al. | 438/329 |
| 4,711,017 A | * | 12/1987 | Lammert | 438/359 |
| 4,712,125 A | * | 12/1987 | Bhatia et al. | 257/557 |
| 4,713,358 A | * | 12/1987 | Bulat et al. | 438/193 |
| 4,717,682 A | * | 1/1988 | Taka et al. | 438/361 |
| 4,719,185 A | * | 1/1988 | Goth | 438/322 |
| 4,725,562 A | * | 2/1988 | El-Kareh et al. | 438/424 |
| 4,810,668 A | * | 3/1989 | Ito | 438/432 |
| 4,819,052 A | * | 4/1989 | Hutter | 257/378 |
| 4,835,115 A | * | 5/1989 | Eklund | 438/426 |
| 4,868,631 A | * | 9/1989 | Hollingsworth et al. | 257/517 |
| 4,871,685 A | * | 10/1989 | Taka et al. | 438/361 |
| 4,910,567 A | * | 3/1990 | Malhi | 257/296 |
| 4,910,572 A | * | 3/1990 | Kameyama | 257/508 |
| 4,963,505 A | * | 10/1990 | Fujii et al. | 438/405 |
| 4,980,747 A | * | 12/1990 | Hutter et al. | 257/513 |
| 4,984,048 A | * | 1/1991 | Sagara et al. | 257/520 |
| 4,992,843 A | * | 2/1991 | Blossfeld et al. | 257/514 |
| 5,003,365 A | * | 3/1991 | Havemann et al. | 257/514 |
| 5,008,208 A | * | 4/1991 | Liu et al. | 438/361 |
| 5,026,658 A | * | 6/1991 | Fuse et al. | 438/248 |
| 5,072,269 A | * | 12/1991 | Hieda | 257/302 |
| 5,105,253 A | * | 4/1992 | Pollock | 257/514 |
| 5,106,777 A | * | 4/1992 | Rodder | 438/426 |
| 5,108,783 A | * | 4/1992 | Tanigawa et al. | 438/359 |
| 5,110,749 A | * | 5/1992 | Ikeda | 438/322 |
| 5,241,210 A | * | 8/1993 | Nakagawa et al. | 257/487 |
| 5,250,837 A | * | 10/1993 | Sparks | 257/519 |
| 5,306,940 A | * | 4/1994 | Yamazaki | 257/374 |
| 5,340,753 A | | 8/1994 | Bassous et al. | |
| 5,411,898 A | * | 5/1995 | Kinoshita et al. | 438/322 |
| 5,420,061 A | * | 5/1995 | Manning | 438/218 |
| 5,534,450 A | * | 7/1996 | Kim | 438/224 |
| 5,541,120 A | * | 7/1996 | Robinson et al. | 438/202 |
| 5,541,440 A | * | 7/1996 | Kozai et al. | 257/513 |
| 5,770,504 A | * | 6/1998 | Brown et al. | 438/296 |
| 5,856,700 A | * | 1/1999 | Woodbury | 257/518 |
| 5,859,459 A | * | 1/1999 | Ikeda | 257/374 |
| 6,056,392 A | * | 5/2000 | Matsumoto et al. | 347/59 |
| 6,097,076 A | * | 8/2000 | Gonzalez et al. | 257/513 |
| 6,104,078 A | * | 8/2000 | Iida et al. | 257/524 |
| 6,121,668 A | * | 9/2000 | Soderbarg et al. | 257/510 |
| 6,144,086 A | * | 11/2000 | Brown et al. | 257/510 |
| 6,184,565 B1 | * | 2/2001 | Beasom | 257/487 |
| 6,207,493 B1 | * | 3/2001 | Furukawa et al. | 438/246 |
| 6,207,512 B1 | * | 3/2001 | Manning | 438/294 |
| 6,242,770 B1 | * | 6/2001 | Bronner et al. | 257/295 |
| 6,255,689 B1 | * | 7/2001 | Lee | 257/314 |
| 6,258,661 B1 | * | 7/2001 | Furukawa et al. | 438/249 |
| 6,406,972 B2 | * | 6/2002 | Norstrom et al. | 438/404 |
| 6,426,526 B1 | * | 7/2002 | Divakaruni et al. | 257/302 |
| 6,445,044 B2 | * | 9/2002 | Manning | 257/372 |
| 6,455,902 B1 | * | 9/2002 | Voldman | 257/378 |
| 6,455,919 B1 | * | 9/2002 | Brennan et al. | 257/616 |
| 6,465,304 B1 | * | 10/2002 | Blanchard et al. | 438/268 |
| 6,538,294 B1 | * | 3/2003 | Sjodin et al. | 257/409 |
| 6,562,634 B2 | * | 5/2003 | Bronner et al. | 438/3 |
| 6,573,137 B1 | * | 6/2003 | Divakaruni et al. | 438/248 |
| 6,586,818 B1 | * | 7/2003 | Voldman | 257/587 |
| 6,605,862 B2 | * | 8/2003 | Van Dalen et al. | 257/621 |
| 6,689,672 B2 | * | 2/2004 | Gris et al. | 438/522 |
| 6,740,954 B2 | * | 5/2004 | Lee | 257/499 |
| 6,750,526 B2 | * | 6/2004 | Nakashima | 257/509 |
| 6,794,250 B2 | * | 9/2004 | Chang et al. | 438/259 |
| 6,844,239 B2 | * | 1/2005 | Lee | 438/433 |
| 6,891,251 B2 | | 5/2005 | Coolbaugh et al. | |
| 6,989,557 B2 | * | 1/2006 | Chen | 257/197 |
| 6,995,449 B1 | * | 2/2006 | Yin et al. | 257/520 |
| 7,015,115 B1 | * | 3/2006 | Yin et al. | 438/431 |
| 7,022,573 B2 | * | 4/2006 | Hsiao et al. | 438/259 |
| 7,071,531 B2 | * | 7/2006 | Rhodes | 257/519 |
| 7,442,996 B2 | * | 10/2008 | Collins et al. | 257/371 |
| 7,465,969 B2 | * | 12/2008 | Ohnishi et al. | 257/198 |
| 7,489,016 B2 | * | 2/2009 | Williams et al. | 257/500 |
| 2001/0010938 A1 | * | 8/2001 | Bronner et al. | 438/3 |
| 2002/0084506 A1 | * | 7/2002 | Voldman et al. | 257/511 |
| 2002/0130392 A1 | * | 9/2002 | Brennan et al. | 257/616 |
| 2004/0222486 A1 | * | 11/2004 | Ellis-Monaghan et al. | 257/507 |
| 2005/0014344 A1 | * | 1/2005 | Choi | 438/433 |
| 2005/0225910 A1 | | 10/2005 | Stricker et al. | |
| 2007/0048928 A1 | * | 3/2007 | Johansson et al. | 438/234 |
| 2009/0261312 A1 | * | 10/2009 | Gruening-von Schwerin | 257/2 |

* cited by examiner

DEEP TRENCH BASED FAR SUBCOLLECTOR REACHTHROUGH

FIELD OF THE INVENTION

The present invention relates to semiconductor structures, and particularly to semiconductor structures with a far subcollector and a deep trench based far subcollector reachthrough and methods of manufacturing the same.

BACKGROUND OF THE INVENTION

Some high performance passive semiconductor devices benefit from increased depth of a buried doped layer within a semiconductor substrate. For example, an increase in the subcollector depth in a bipolar transistor offers the advantage of an increased breakdown voltage. For another example, the operating frequency of a positive-intrinsic-negative (PIN) diode, in which an intrinsic semiconductor area is sandwiched between a p-doped semiconductor area and an n-doped area, increases with the depth of a buried doped layer, which functions as one terminal of the PIN diode.

According to conventional semiconductor manufacturing methods, the depth of a buried doped layer is typically limited by the ability to form a reachthrough to the buried doped layer. While a deep buried doped layer may be formed by implanting a semiconductor region followed by an epitaxy of semiconductor material of significant thickness, for example, greater than 2 microns, the depth of the reachthrough that can be formed by ion implantation is limited by the projected range of the implanted ions. For example, the projected range of boron ions in silicon accelerated at 1.0 MeV is only about 1.8 microns. The projected ranges for phosphorus ions and arsenic ions accelerated at 1.0 MeV are even less, and are only about 1.2 microns and 0.6 microns, respectively. In addition, the buried doped layers often require heavy doping concentrations on the order of $5.0 \times 10^{20}/cm^3$ to achieve low resistivity. Implantation of dopants at such high energy and at such a high dose requires a long implantation time on a high performance ion implanter, and consequently, high processing costs. Further, even if such processing steps are employed, the depth of a buried doped layer does not exceed 2.0 microns unless the ion implantation energy is increased even higher, which is difficult to achieve with commercially available ion implanters.

A method of forming a buried doped layer, or a "far subcollector", at a depth greater than the projected range implanted ions by employing multiple stages of reachthroughs is known in the prior art. According to this method, a doped region is formed on an initial semiconductor substrate. A first epitaxial semiconductor layer is grown on the surface of the initial semiconductor substrate up to a thickness through which a reachthrough may be formed by ion implantation, that is, up to the thickness of the projected range of ions of the subsequent ion implantation process. After the formation of a first reachthrough within the first epitaxially grown layer, a second epitaxial semiconductor layer is grown on the first epitaxially grown layer. A second reachthrough is formed by ion implantation into the second epitaxially grown layer. According to this prior art, each round of epitaxial growth of a semiconductor layer extends the depth of a buried semiconductor layer by the projected range of the subsequent ion implantation, that is, by the depth of the reachthrough subsequently formed therein. The increase in the depth of the buried doped layer is practically limited to less than about 1.2~1.8 microns due to the energy limitations on the available ion implanters. Further, high temperature requirement for epitaxy of a semiconductor material causes bulk diffusion of the dopants in the buried doped layer, thereby reducing the depth of the buried doped layer and also reducing the doping density, and consequently, the conductivity of the buried doped layer.

Therefore, there exists a need to provide semiconductor structures with a buried doped layer, or a "far subcollector," located at a depth that exceeds typical projected ranges of ion implantation process, and a reachthrough that electrically connects the far subcollector to a structure at a surface of a semiconductor substrate, and methods of manufacturing the same.

Further, there exists a need to provide semiconductor structures with a far subcollector and a reachthrough to the far subcollector and methods of manufacturing the same with minimum additional processing steps and processing costs.

SUMMARY OF THE INVENTION

The present invention addresses the needs described above by providing a semiconductor structure with a far subcollector contacting a reachthrough region that is formed on and outside a wall of at least one deep trench and methods of manufacturing the same.

Specifically, the present invention forms a far subcollector on a surface of an initial semiconductor substrate, followed by a thick epitaxial growth of a semiconductor material. The initial semiconductor substrate and the epitaxially grown semiconductor portion collectively form a semiconductor substrate. At least one deep trench is formed from over a portion of the far subcollector and adjoins the far subcollector. A doped material layer is deposited on the wall of the at least one deep trench. Dopants diffuse out from the doped material layer on the wall of the at least on deep trench into the semiconductor substrate during a drive-in anneal. A reachthrough region to the far subcollector is formed by the doped semiconductor region on the outer wall of the at least one deep trench. Contacts may be made to the reachthrough region. Alternatively, a secondary reachthrough region may be formed and contacts may be made thereto.

According to a first embodiment of the present invention, a semiconductor structure comprises:

a far subcollector located in a semiconductor substrate and doped with dopants of one conductivity type;

at least one deep trench located in the semiconductor substrate;

a reachthrough region located on and outside a wall of the at least one deep trench, adjoining the far subcollector, and doped with dopants of the one conductivity type; and at least one secondary reachthrough region located on the reachthrough region, contacting a top surface of the semiconductor substrate, and doped with dopants of the one conductivity type.

According to the first embodiment of the present invention, the semiconductor structure preferably comprises a dielectric layer located on and inside the reachthrough region. The semiconductor structure preferably further comprises:

a fill material within the dielectric layer; and a shallow trench isolation over the fill material, wherein the dielectric layer and the fill material are located directly beneath the shallow trench isolation.

The dielectric layer may be silicon nitride, silicon oxide, or silicon oxynitride. The dielectric layer may be doped with the dopants of the one conductivity type. The dielectric layer may be selected from the group consisting of borosilicate glass (BSG), phosphosilicate glass (PSG), and arsenosilicate glass (ASG).

The semiconductor structure may further comprise a guard ring region located directly beneath the at least one deep trench and doped with dopants of another conductivity type, which is the opposite of the one conductivity type. In this case, the reachthrough region may be topologically homeomorphic to a torus, i.e., the reachthrough region may be transformed into a torus by continuous stretching and bending.

The semiconductor structure may further comprise a metal contact located on the at least one secondary reachthrough region.

According to a second embodiment of the present invention, a semiconductor structure comprises:

a far subcollector located in a semiconductor substrate and doped with dopants of one conductivity type;

at least one deep trench located in the semiconductor substrate;

a reachthrough region located on and outside a wall of the at least one deep trench, adjoining the far subcollector, and doped with dopants of the one conductivity type;

a doped fill material located within the at least one deep trench and doped with dopants of the one conductivity type; and a metal contact located on the doped fill material.

According to the second embodiment of the present invention, the semiconductor structure preferably comprises a dielectric layer located on and inside the wall of the at least one deep trench, wherein both the dielectric layer and the reachthrough region are topologically homeomorphic to a sphere, i.e., the reachthrough region may be transformed into a sphere by continuous stretching and bending. Preferably, the dielectric layer is located on one side of the at least one deep trench and the reachthrough region is located on the opposite side of the at least one deep trench.

The semiconductor structure may further comprise shallow trench isolation, wherein the dielectric layer and the reachthrough region are directly beneath the shallow trench isolation.

The dielectric layer may be silicon nitride, silicon oxide, or silicon oxynitride. The dielectric layer may be doped with the dopants of the one conductivity type. The dielectric layer may be selected from the group consisting of borosilicate glass (BSG), phosphosilicate glass (PSG), and arsenosilicate glass (ASG).

The semiconductor structure may further comprise a guard ring region located directly beneath the at least one deep trench and doped with dopants of another conductivity type, which is the opposite of the one conductivity type.

According to both embodiments of the present invention, the semiconductor substrate preferably comprises an epitaxially grown semiconductor portion that adjoins the far subcollector. The subcollector is preferably located at a depth that exceeds projected ranges of conventional ion implantation, and more preferably at a depth that is in the range from about 1.0 microns to about 8.0 microns, and most preferably in the range from about 2.0 microns to 5.0 microns, as measured from a top surface of the semiconductor substrate.

According to both embodiments of the present invention, the dopants of the one conductivity type may be p-type, or alternatively n-type. If the dopants of the one conductivity type are p-type, then the dopants of another conductivity type are n-type. If the dopants of the one conductivity type are n-type, then the dopants of another conductivity type are p-type.

According to the present invention, a method of forming the semiconductor structure of the first embodiment of the present invention comprises:

forming a far subcollector in a semiconductor substrate, wherein the far subcollector is doped with dopants of one conductivity type;

forming at least one deep trench in the semiconductor substrate, wherein the at least one deep trench adjoins the far subcollector;

forming a reachthrough region on and outside a wall of the at least one deep trench, wherein the reachthrough region is doped with dopants of the one conductivity type, and adjoins the far subcollector; and forming a secondary reachthrough region, wherein the secondary reachthrough region is doped with dopants of the one conductivity type, contacts a top surface of the semiconductor substrate, and adjoins the at least one deep trench.

Preferably, the far subcollector in the semiconductor substrate is formed by ion implantation of a portion of an initial semiconductor substrate followed by an epitaxial growth of a semiconductor material on the initial semiconductor substrate.

A guard ring region may be formed directly beneath the at least one deep trench and doped with dopants of another conductivity type, which is the opposite of the one conductivity type. In this case, the reachthrough region is topologically homeomorphic to a torus.

A doped material layer may be deposited inside the at least one deep trench, wherein the doped material layer contains dopants of the one conductivity type, and the dopants of the one conductivity type from the doped material layer may be driven in into the semiconductor substrate in an anneal step.

A dielectric layer may be formed on and inside the reachthrough region. The dielectric layer on and inside the reachthrough region may be formed by thermally oxidizing the doped material layer. Alternatively, the dielectric layer may be formed by deposition after removing the doped material layer.

Further, a fill material may be formed in the volume surrounded by the dielectric layer, and shallow trench isolation may thereafter be formed over the fill material, wherein the shallow trench isolation is formed directly on and over the dielectric layer and the fill material. The fill material according to the present invention may or may not be doped.

A metal contact may be formed on the at least one secondary reachthrough region.

According to the present invention, a method of forming the semiconductor structure of the second embodiment of the present invention comprises:

forming a far subcollector in a semiconductor substrate, wherein the far subcollector is doped with dopants of one conductivity type;

forming at least one deep trench in the semiconductor substrate, wherein the at least one deep trench adjoins the far subcollector;

forming a reachthrough region on and outside a wall of the at least one deep trench, wherein the reachthrough region is doped with dopants of the one conductivity type and adjoins the far subcollector;

forming a doped fill material within the at least one deep trench and doped with dopants of the one conductivity type; and forming a metal contact located on the doped fill material.

Preferably, the far subcollector in the semiconductor substrate is formed by ion implantation of a portion of an initial semiconductor substrate followed by an epitaxial growth of a semiconductor material on the initial semiconductor substrate.

A guard ring region may be formed directly beneath the at least one deep trench and doped with dopants of another conductivity type, which is the opposite of the one conductivity type.

A dielectric layer may be formed on and inside the wall of the at least one deep trench, wherein both the dielectric layer and the reachthrough region are topologically homeomorphic to a sphere. In this case, the dielectric layer may be lithographically patterned with a photoresist and the exposed portion of the dielectric layer may be etched.

Further, shallow trench isolation may be formed directly on and over the dielectric layer and the reachthrough region.

The doped material layer may be selected from the group consisting of borosilicate glass (BSG), phosphosilicate glass (PSG), and arsenosilicate glass (ASG). Alternatively, the doped material layer may be selected from the group consisting of doped polysilicon, doped amorphous silicon, doped polycrystalline silicon containing alloy, and doped amorphous silicon containing alloy. The dielectric layer on and inside the reachthrough region may be formed by thermally oxidizing or nitridating the doped material layer.

DETAILED DESCRIPTION OF THE INVENTION

As stated above, the present invention relates to semiconductor structures with a far subcollector and a deep trench based far subcollector reachthrough and methods of manufacturing the same, which are now described in detail with accompanying figures.

Figure 1:
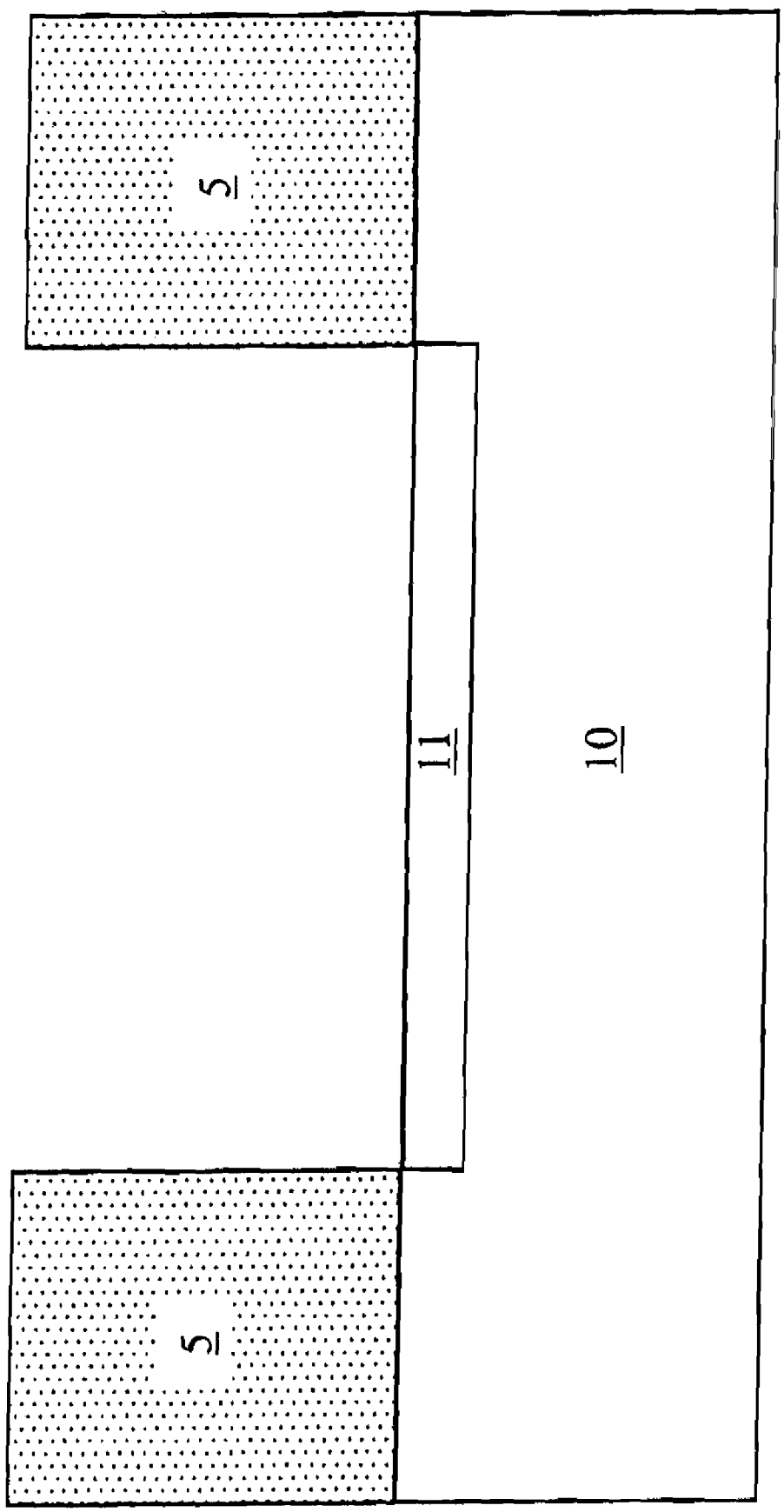
FIGS. 1-3 are sequential vertical cross-sectional views of an exemplary structure according to the first and second embodiments of the present invention.

Referring to FIG. 1, a vertical cross-sectional view of an initial semiconductor substrate 10 is shown. According to the present invention, a photoresist 5 is applied to a top surface of the initial semiconductor substrate 10 and lithographically patterned to define an opening in the photoresist 5. Ion implantation is performed into an exposed portion of the initial semiconductor substrate 10 to form an implanted doped region 11. While FIG. 1 shows the implanted doped region 11 that extends to a surface of the initial semiconductor substrate 10, formation of the implanted doped region 11 beneath the surface of the initial semiconductor substrate 10 may alternatively be performed with corresponding changes in the subsequent structures, which is explicitly contemplated herein.

The doping of the implanted doped region 11 may be p-type or n-type. Preferably, the doping concentrations is in the range from about $1.0 \times 10^{20}/cm^3$ to about $5.0 \times 10^{21}/cm^3$, and preferably in the range from about $3.0 \times 10^{20}/cm^3$ to about $2.0 \times 10^{21}/cm^3$ to achieve low resistivity typically on the order of about $1.0 \times 10^{-3}$ Ω-cm or less in the implanted doped region 11.

Figure 2:
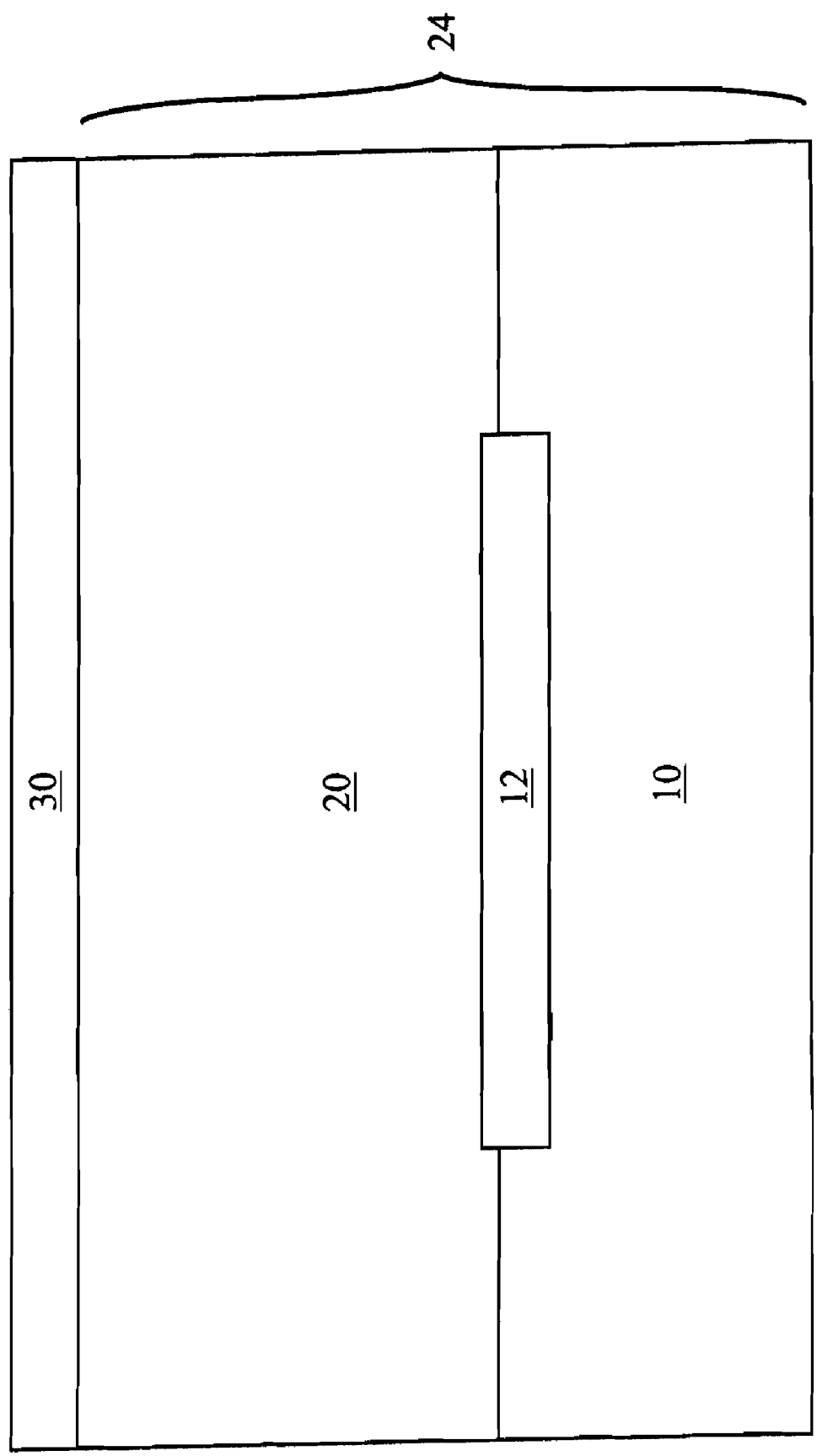

Referring to FIG. 2, the patterned photoresist 5 is thereafter removed. After a suitable surface clean such as a wet etch in a hydrofluoric acid (HF), an epitaxial growth of a semiconductor material is performed to form an epitaxially grown semiconductor portion 20. Due to the addition of the semiconductor material during the epitaxial growth, the implanted doped region 11 is buried underneath the epitaxially grown semiconductor portion 20 to form a far subcollector 12. Due to the high temperature that is typically required to form the epitaxially grown semiconductor portion 20 with low defect density, the dopants in the implanted doped region 11 are subjected to bulk diffusion, and consequently, the thickness of the far subcollector 12 in FIG. 2 typically exceeds the thickness of the implanted doped region 11 in FIG. 1. The initial semiconductor substrate 10 and the epitaxially grown semiconductor portion 20 collectively form a semiconductor substrate 24, within which a far subcollector 12 is embedded.

The initial semiconductor substrate 10 and the epitaxially grown semiconductor portion 20 may comprise the same or different semiconductor materials provided that the lattice mismatch between the two materials is small enough to allow epitaxial growth of the epitaxially grown semiconductor portion 20 on the initial semiconductor substrate 10. Non-limiting examples of semiconductor materials comprising each of the initial semiconductor substrate 10 and the epitaxially grown semiconductor portion 20 may be one of the following: silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials.

The doping concentrations of both the initial semiconductor substrate 10 and the epitaxially grown semiconductor portion 20 are low enough to prevent a high level of leakage current through the semiconductor material itself. For example, the doping concentrations may be below $5.0 \times 10^{17}/cm^3$, and preferably below $1.0 \times 10^{16}/cm^3$ in both the initial semiconductor substrate 10 and the epitaxially grown semiconductor portion 20.

Optionally, but preferably, a pad layer 30 is deposited on the semiconductor substrate 24. The pad layer 30 may comprise a silicon oxide layer, a silicon nitride layer, or a stack of a silicon oxide layer and a silicon nitride layer.

Figure 3:
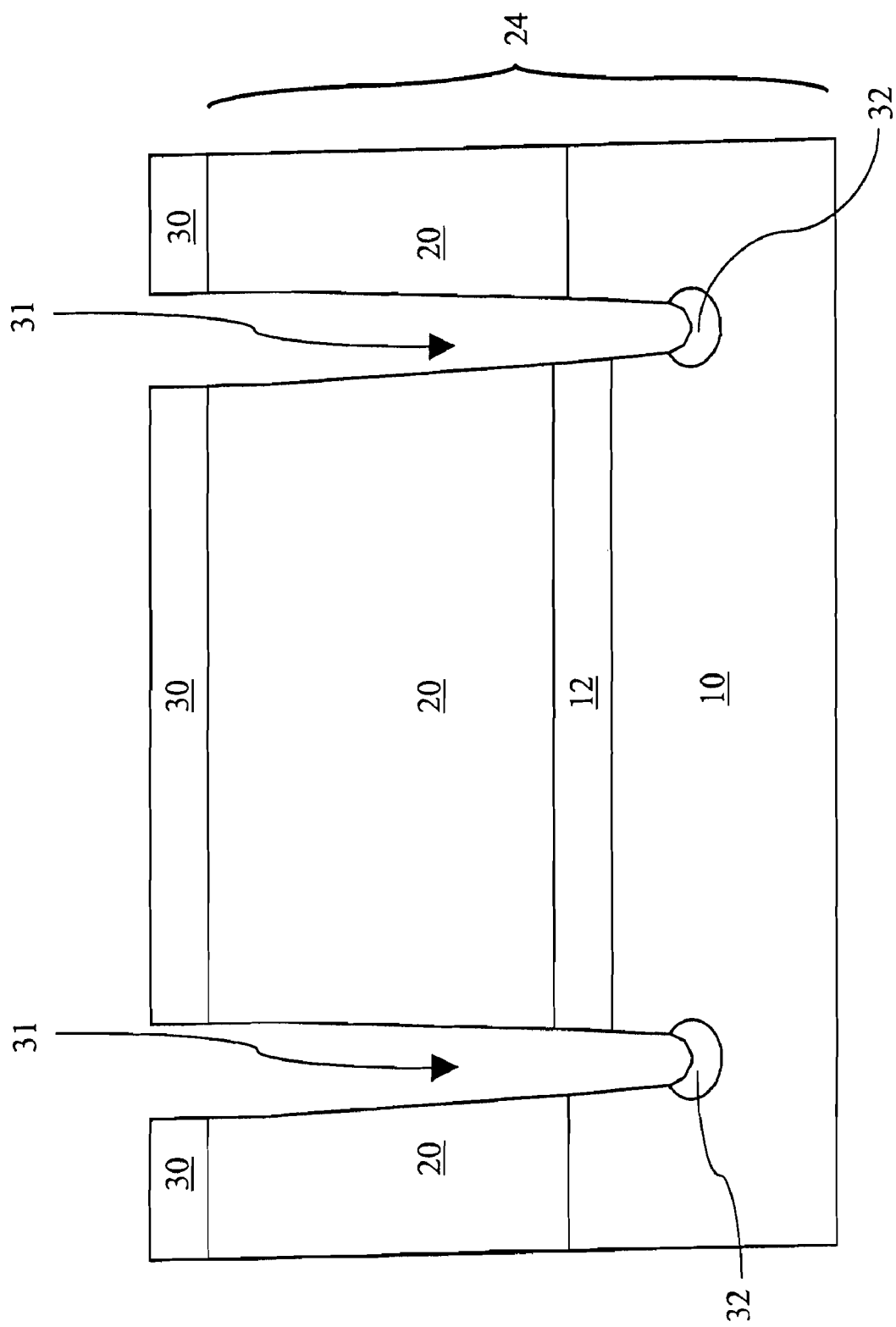

Referring to FIG. 3, at least one deep trench 31 is formed in the semiconductor substrate 24 by applying and lithographically patterning a photoresist (not shown) and transferring the pattern in the photoresist into the optional pad layer 30 and into the semiconductor substrate 24. The method of forming deep trenches with a depth exceeding 2.0 micron is well known in the art. The deep trenches may be formed with a depth in the range from about 2.0 micron to about 8.0 micron. At least a wall of the at least one deep trench 31 adjoins the far subcollector 12, i.e., the at least one deep trench 31 intersects the far subcollector 12 during the etching of the at least one deep trench 31.

Figure 4:
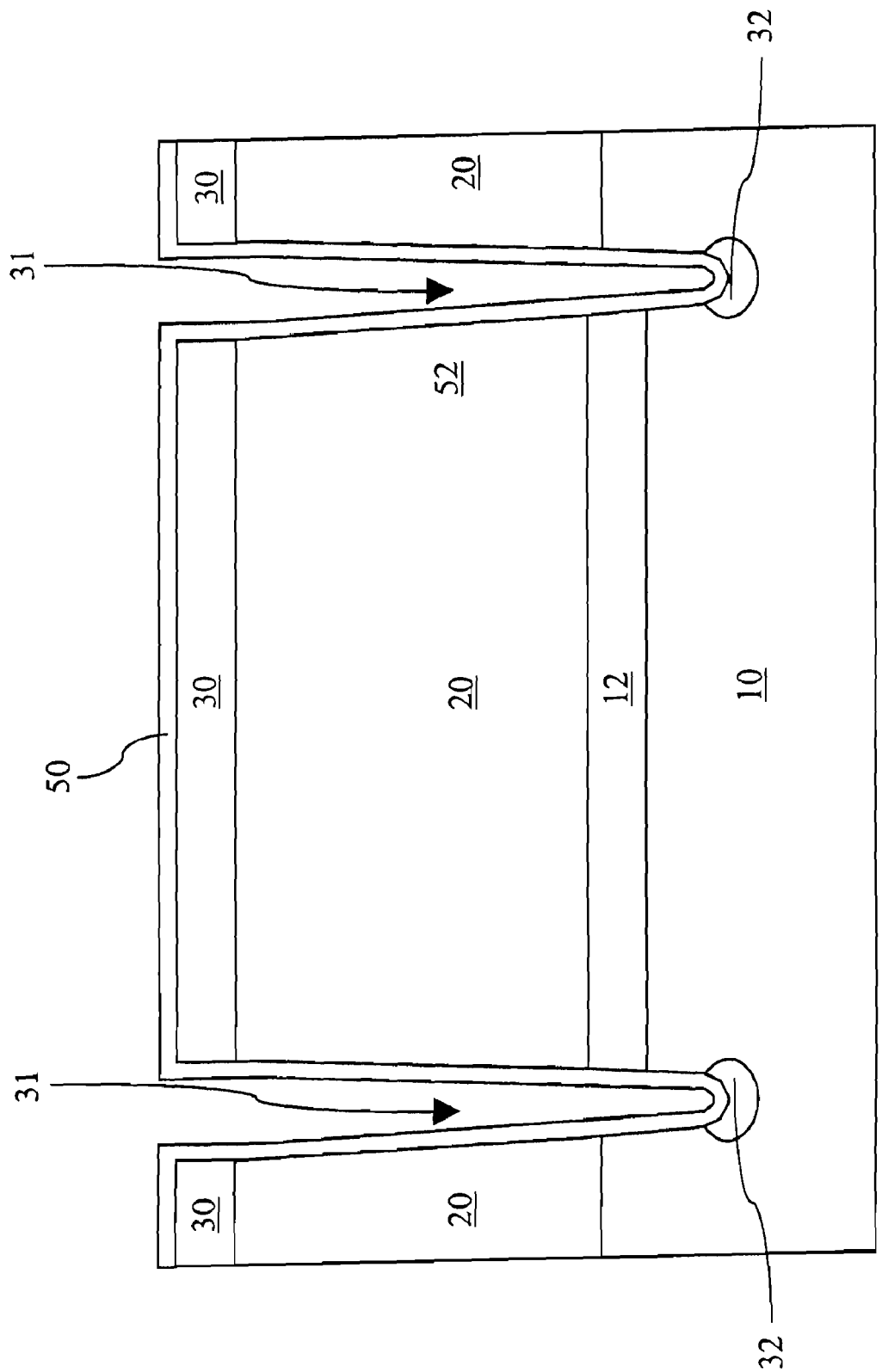
FIGS. 4-10 are sequential vertical cross-sectional views of an exemplary structure according to the first embodiment of the present invention.

Optionally but preferably, a guard ring region 32 may be formed directly beneath the at least one deep trench 31 by implanting dopants of the opposite conductivity type than the dopants in the far subcollector 12. The ion implantation may be performed either after removing the photoresist for deep trench etch, or preferably, prior to removing the photoresist so that only the bottom of the at least one deep trench 31 is implanted with the dopants during the ion implantation. The guard ring region 32, having the opposite dopant type than the far subcollector 12 or a reachthrough region to be subsequently formed, provides a p-n junction so that latch up may be prevented. The dopant concentration in the guard ring region 32 is high enough such that outdiffusion of dopants from a doped material layer to be subsequently performed does not reverse the polarity of the doping type within the guard ring region 32. The doping concentration in the guard ring region 32 is in the range from about $1.0 \times 10^{20}/cm^3$ to about $5.0 \times 10^{21}/cm^3$, and preferably in the range from about $5.0 \times 10^{20}/cm^3$ to about $2.0 \times 10^{20}/cm^3$ According to a first embodiment of the present invention, a doped material layer 50 is deposited on the walls of the at least one deep trench 31 as shown in FIG. 4. If the optional pad layer 30 is present, the doped material layer 50 is also deposited on the optional pad layer 30 as well. The dopants within the doped material layer 50 are of the same conductivity type as the dopants in the far subcollector 12. The doped material layer 50 may be selected from the group consisting of borosilicate glass (BSG), phosphosilicate glass (PSG), and arsenosilicate glass (ASG). Alternatively, the doped material layer may be selected from the group consisting of doped polysilicon, doped amorphous silicon, doped polycrystalline silicon containing alloy, and doped amorphous silicon containing alloy.

Figure 5:
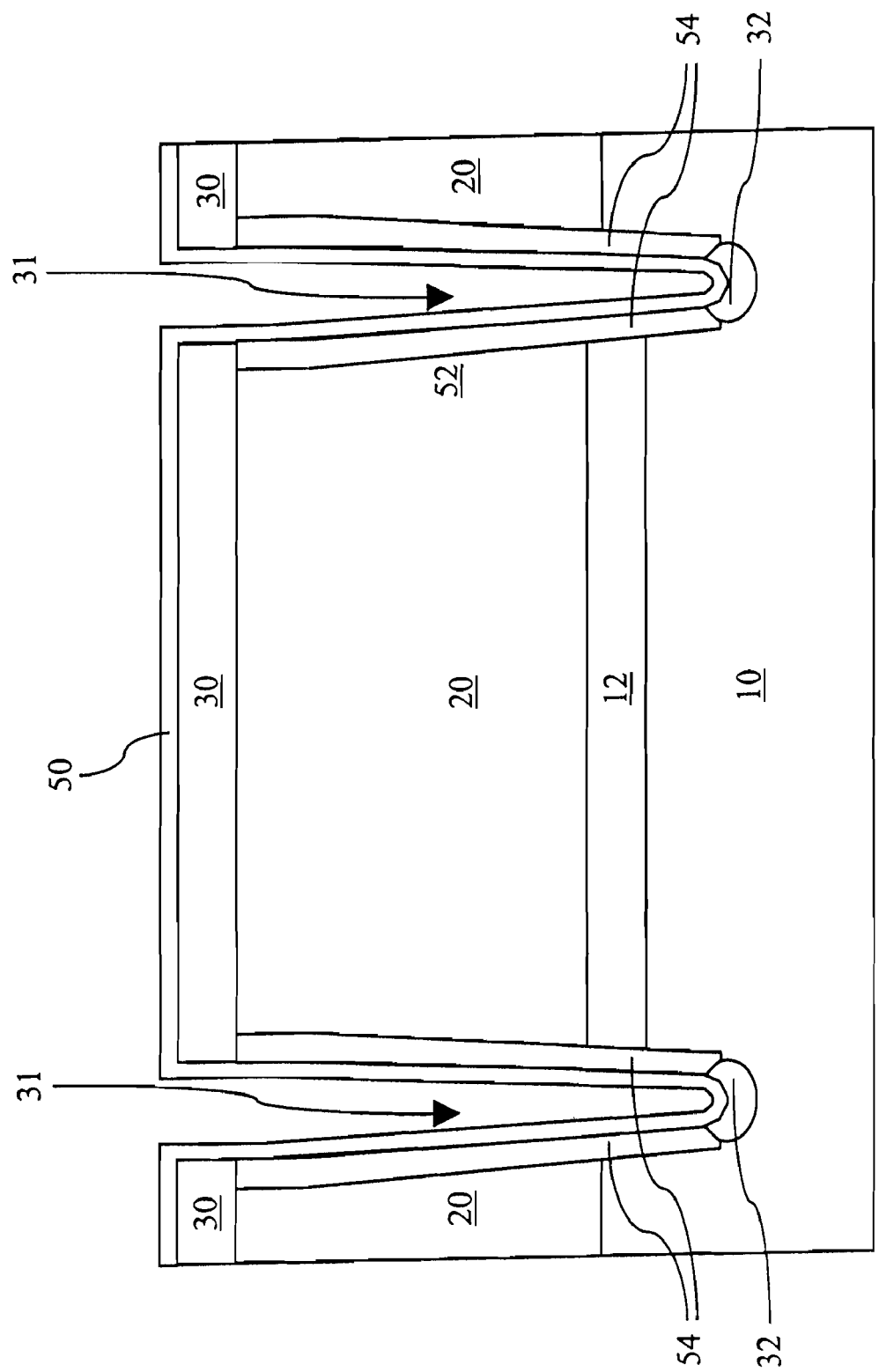

Referring to FIG. 5, a thermal anneal is performed to drive in the dopants from the doped material layer 50 into the semiconductor substrate 24 to form a reachthrough region 54. Methods of performing a drive-in anneal are well known in the prior art. Dopants within the reachthrough region 54 are of the same conductivity type as the dopants in the far subcollector 12, but are of the opposite conductivity type to the dopants in the guard ring region 32. The peak doping concentration within the reachthrough region 54 is in the range from about $1.0 \times 10^{19}/cm^3$ to about $1.0 \times 10^{21}/cm^3$, and preferably in the range from about $5.0 \times 10^{19}/cm^3$ to about $5.0 \times 10^{20}/cm^3$, with a gradual radial decrease in the doping concentration from the center of the at least one deep trench 31. Due to sufficiently high level of dopants in the guard ring region 32, the guard ring region 32 maintains the same type of doping after the drive-in anneal.

If the guard ring region 32 is formed, the reachthrough region 54 according to the first embodiment of the present invention may have a shape of a tapered cylinder, and may therefore be topologically homeomorphic to a torus, i.e., the reachthrough region may be transformed into a torus by continuous stretching and bending. If the guard ring region 32 is not formed, the reachthrough region 54 according to the first embodiment of the present invention may have a shape of a cup, and may therefore be topologically homeomorphic to a sphere, i.e., the reachthrough region may be transformed into a sphere by continuous stretching and bending. While the description of the present invention refers to "a reachthrough region" 54, implementation of the present invention to multiple reachthrough regions 54 is straightforward and is herein explicitly contemplated. Multiple reachthrough regions 54 may be adjoined among themselves as needed.

Figure 6:
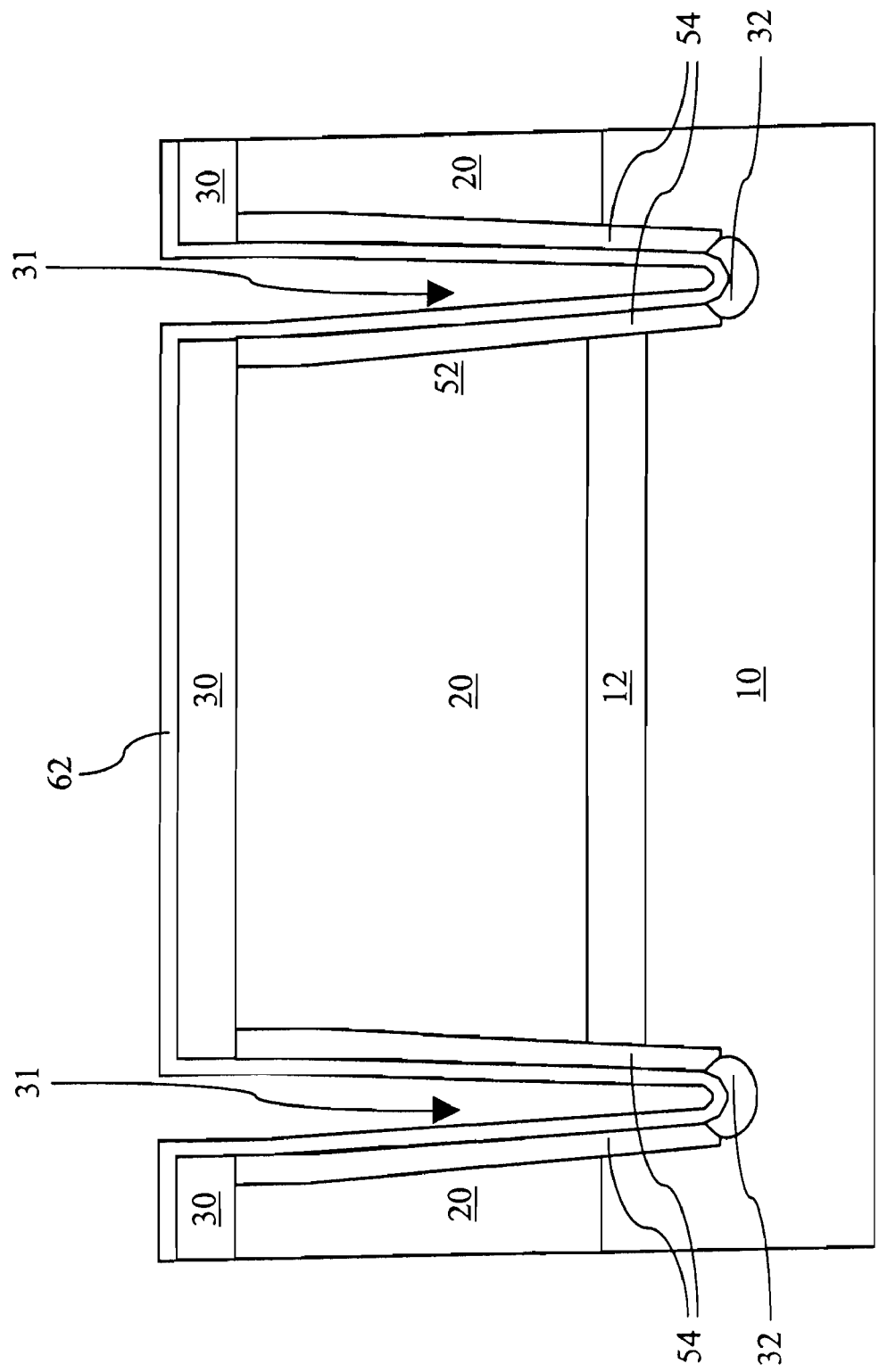

Referring to FIG. 6, a dielectric layer 62 is formed on a wall of the at least one deep trench 31. The dielectric layer 62 may be the remainder of the doped material layer 50 after the drive-in anneal if the doped material layer 50 is selected from the group consisting of borosilicate glass (BSG), phosphosilicate glass (PSG), and arsenosilicate glass (ASG). Alternatively, the dielectric layer 62 may be formed by oxidizing or nitridating the doped material layer 50 after the drive-in anneal if the doped material layer 50 is selected from the group consisting of doped polysilicon, doped amorphous silicon, doped polycrystalline silicon containing alloy, and doped amorphous silicon containing alloy. According to yet another alternative method, the dielectric layer 62 may be deposited, for example, by chemical vapor deposition (CVD) or alternating layer deposition (ALD), after removing the doped material layer 50. The dielectric layer 62 is an insulator that does not conduct electricity.

Figure 7:
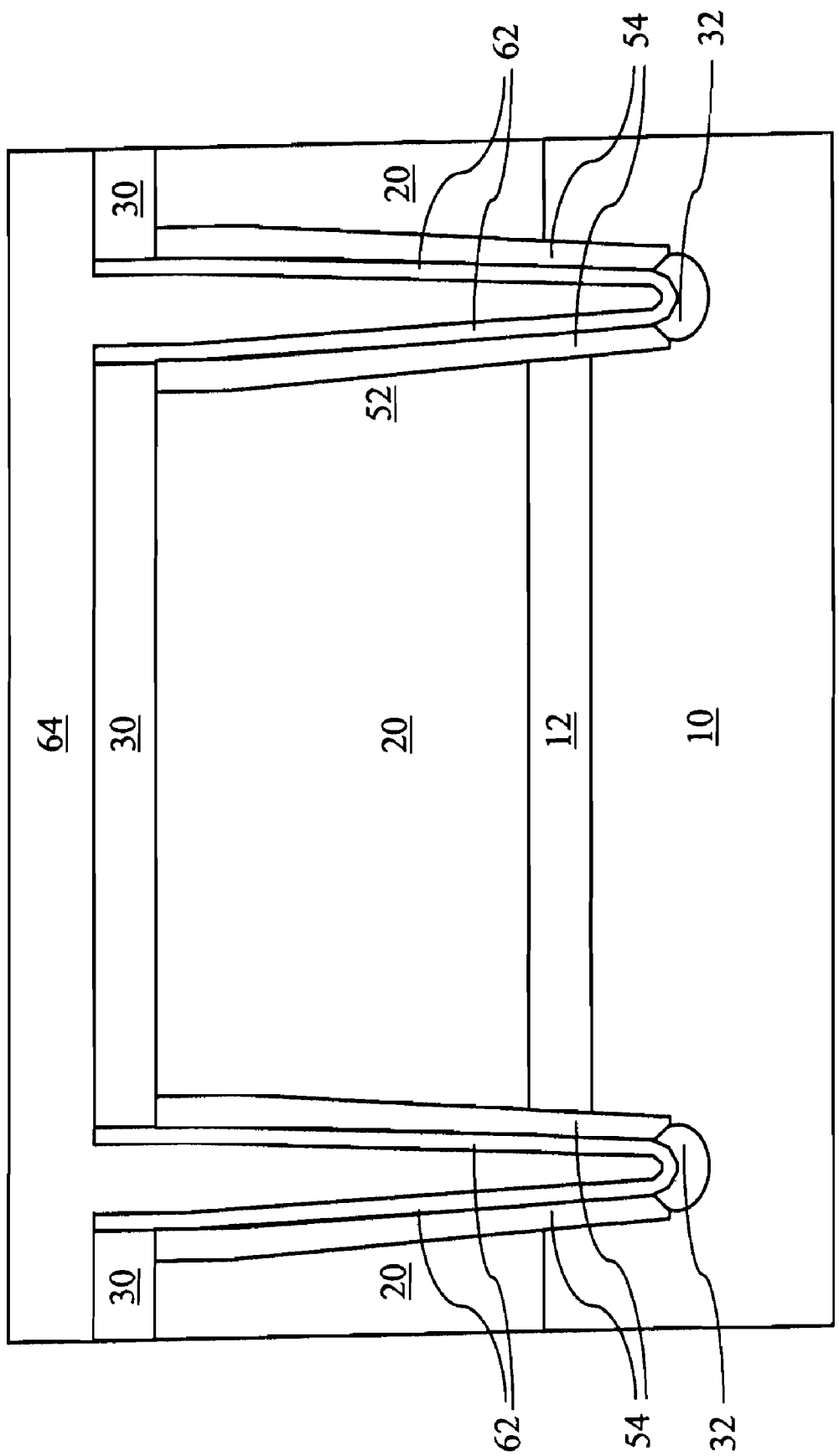

Referring to FIG. 7, a fill material 64 fills the at least one deep trench 31. The fill material 64 may be doped or undoped, and may comprise polysilicon, amorphous silicon, polycrystalline silicon containing alloy, or an amorphous silicon containing alloy. Further, the fill material 64 may comprise a dielectric material, for example, silicon oxide, silicon nitride, or silicon oxynitride. The fill material 64 may be a conductor or an insulator. Preferably, the fill material 64 has conformal step coverage, and forms a minimal size seam at the center of the at least one deep trench 31.

Figure 8:
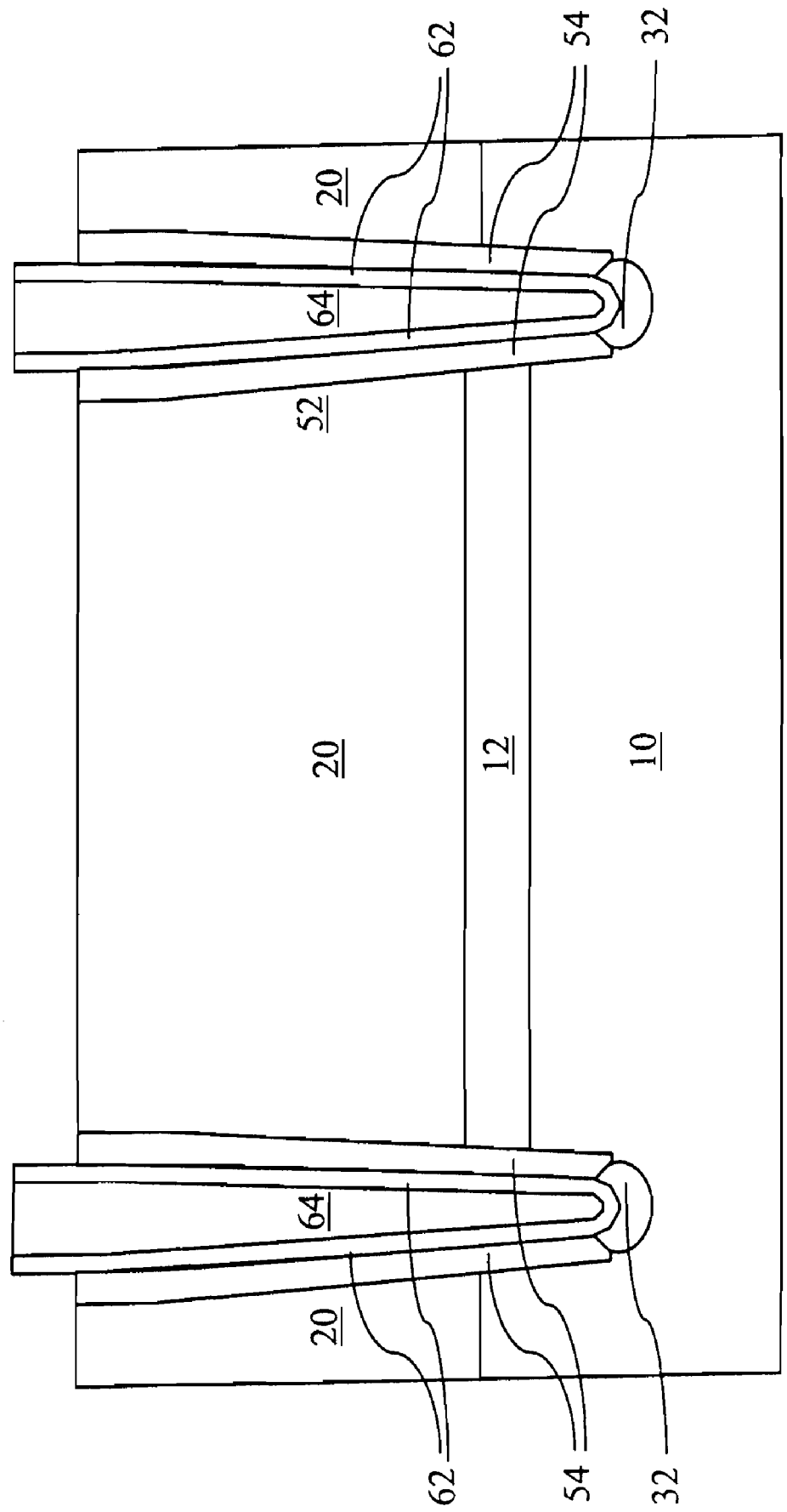

Referring to FIG. 8, the fill material 64 is either recessed by an etch, for example, a wet etch or a reactive ion etch (RIE), or planarized by chemical mechanical planarization (CMP). If the optional pad layer 30 is present, the optional pad layer 30 may be used as an etch stop layer or as a CMP stop layer. Thereafter, the optional pad layer 30 may be removed. Due to a finite thickness in the optional pad layer 30, a pillar comprising a portion of the dielectric layer 62 and a portion of the fill material 64 may protrude from the surface of the semiconductor substrate 24. Such protrusions may be reduced or eliminated by employing a reactive ion etch that recesses the dielectric layer 62 and the fill material 64.

Figure 9:
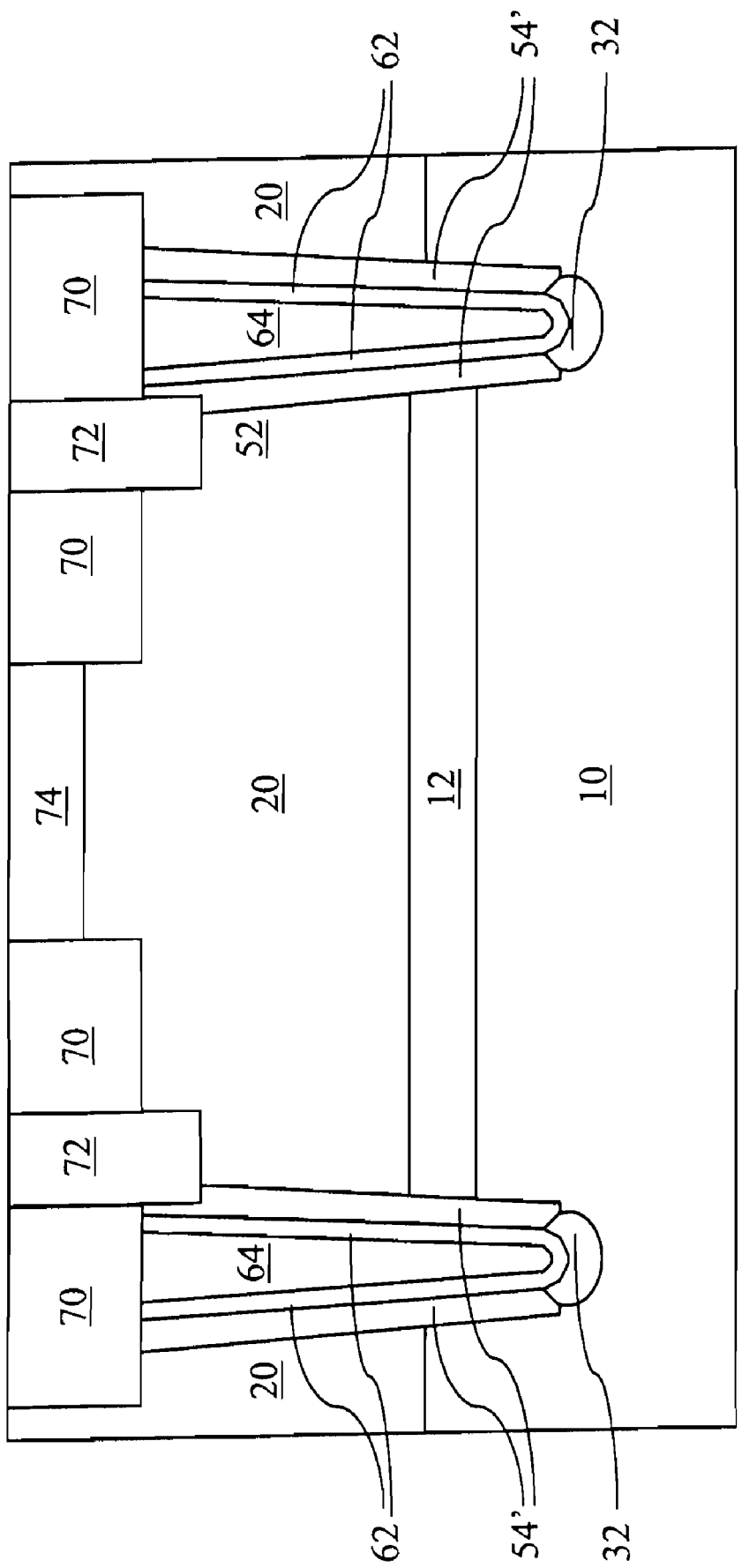

Referring to FIG. 9, shallow trench isolation 70 is formed by conventional methods, e.g., by application and lithographic patterning of a photoresist (not shown), etching shallow trenches in the semiconductor substrate 24, filling the shallow trenches with an insulator, and planarizing the top surface of the resulting semiconductor structure. The area for secondary reachthrough region 72, as seen from the top of the semiconductor substrate 24, may be defined solely by a block mask or by a block mask in combination with the shallow trench isolation 70. The depth of the secondary reachthrough region 72 is defined by the energy and implant species of the ion implantation, and may be higher than, lower than, or of the same height as the bottom of shallow trench isolation 70. The secondary reachthrough region 72 partially overlaps the original reachthrough region 54, or adjoins the reduced reachthrough region 54' (hereafter referred to as reachthrough region 54') that excludes the overlapping area between the secondary reachthrough region 72 and the original reachthrough region 54. The dopants in the secondary reach through region 72 are of the same conductivity type as the dopants in the far subcollector 12.

Doped regions 74 other than the secondary reachthrough region 72 may also be formed at this point by suitable patterning of a photoresist (not shown) and ion implantation. For example, if a doped region 74 is formed in an epitaxially grown semiconductor portion 20 surrounded by the at least one deep trenches 31 and has the opposite type of doping to the doping of the far subcollector 12, the overall structure forms a PIN diode.

Figure 10:
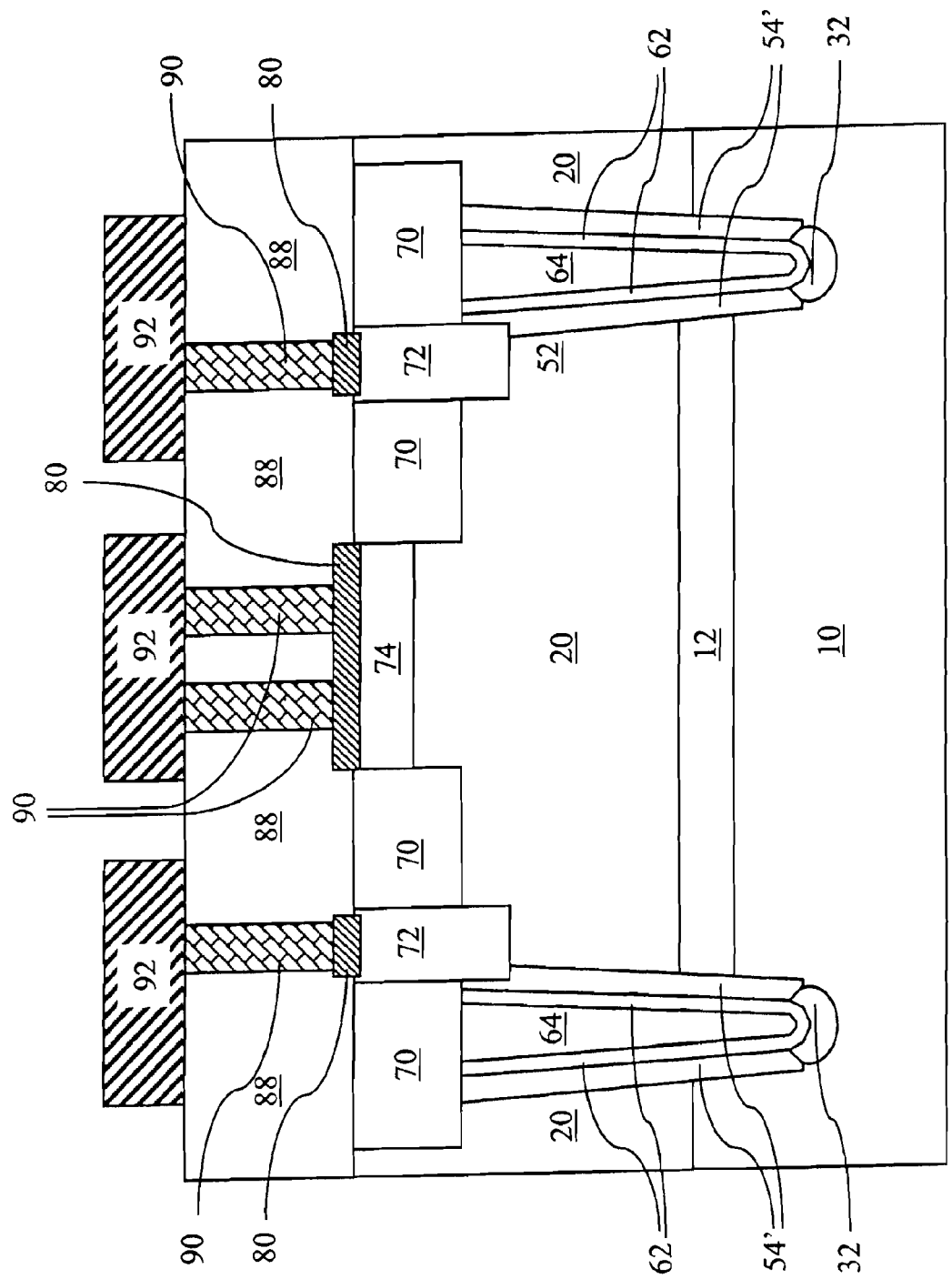

Referring to FIG. 10, a metal contact 80 is preferably formed on the secondary reachthrough 80. Metal contacts 80 may also be formed on other structures such as a doped region 74. Metal contacts may comprise a metal silicide. A middle-of-line (MOL) dielectric 88 is thereafter deposited and planarized followed by formation of contact via holes that are subsequently filled with contact vias 90. Metal wiring 92 is connected to the contact vias 90.

Figure 11:
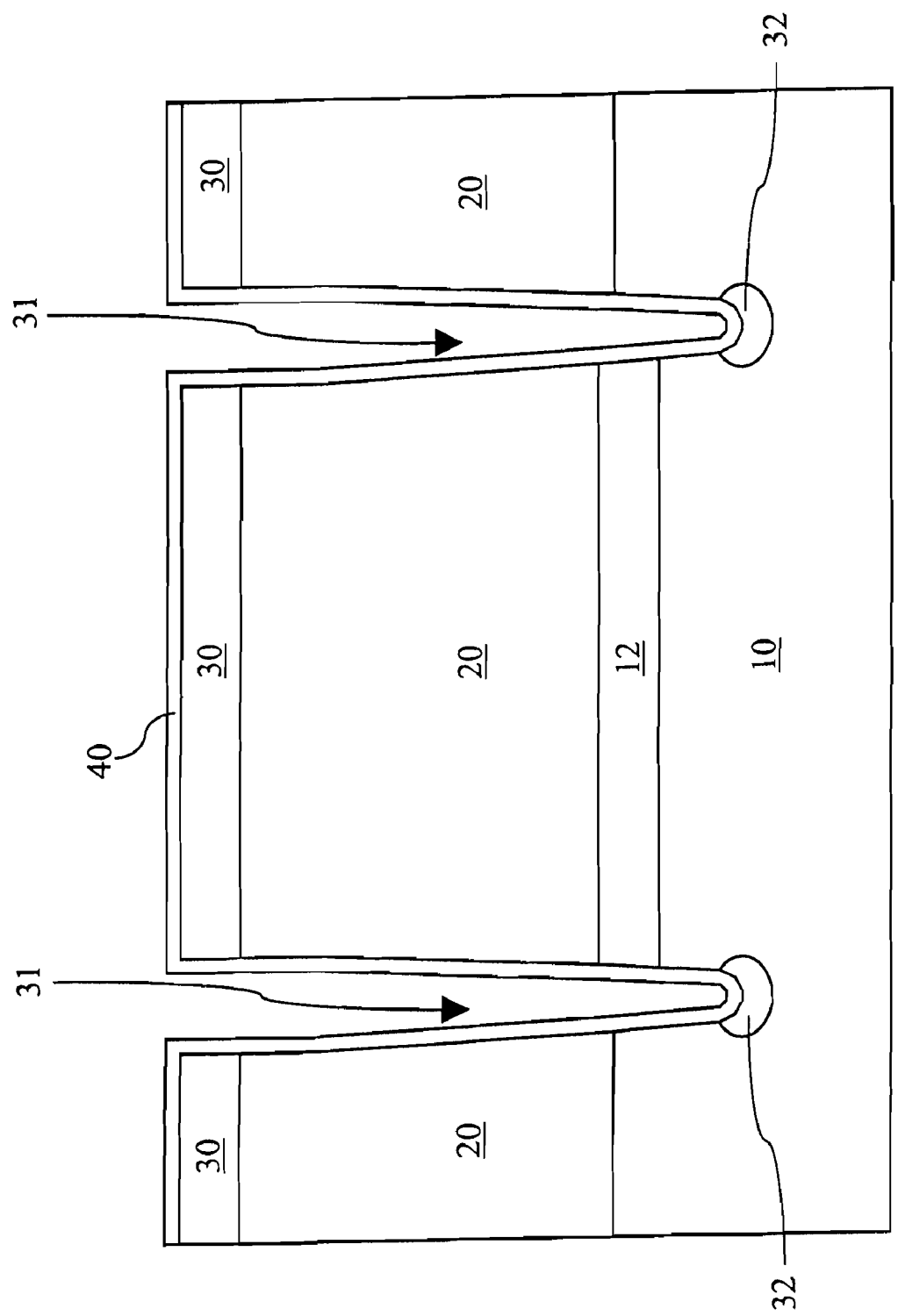
FIGS. 11-17 are sequential vertical cross-sectional views of an exemplary structure according to the second embodiment of the present invention.

According to a second embodiment of the present invention, a dielectric layer 40 is deposited on the walls of the at least one deep trench 31 as shown in FIG. 11. If the optional pad layer 30 is present, the dielectric layer 40 is also deposited on the optional pad layer 30 as well. The dielectric layer 40 preferably blocks diffusion of dopants. The dielectric layer 40 may comprise a silicon oxide layer, silicon nitride layer, a silicon oxynitride layer, or a stack thereof. Preferably, the dielectric layer 40 comprises a silicon nitride layer.

Figure 12:
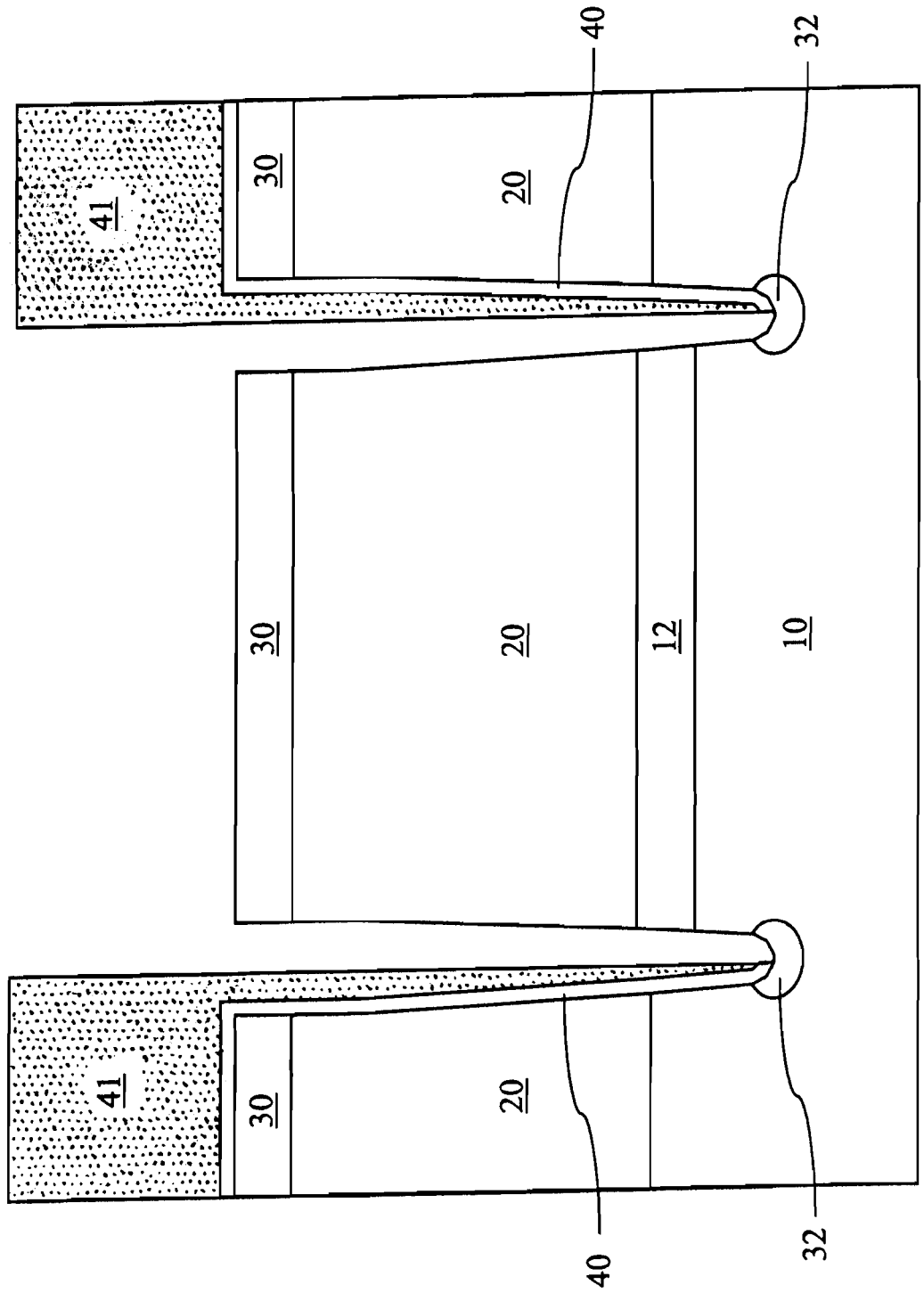

Referring to FIG. 12, a photoresist 41 is applied to the top surface of the semiconductor substrate 24 and patterned such that only a portion of each of the at least one deep trench 31 is masked by the photoresist 41 while the remaining portion of each of the at least one deep trench 31 is exposed. The exposed portion of the at least one deep trench 31 is etched either by a wet etch or by a reactive ion etch (RIE). Preferably, the wet etch or the reactive ion etch is selective to the underlying semiconductor material in the semiconductor substrate 24 and to the optional pad layer 30.

Figure 13:
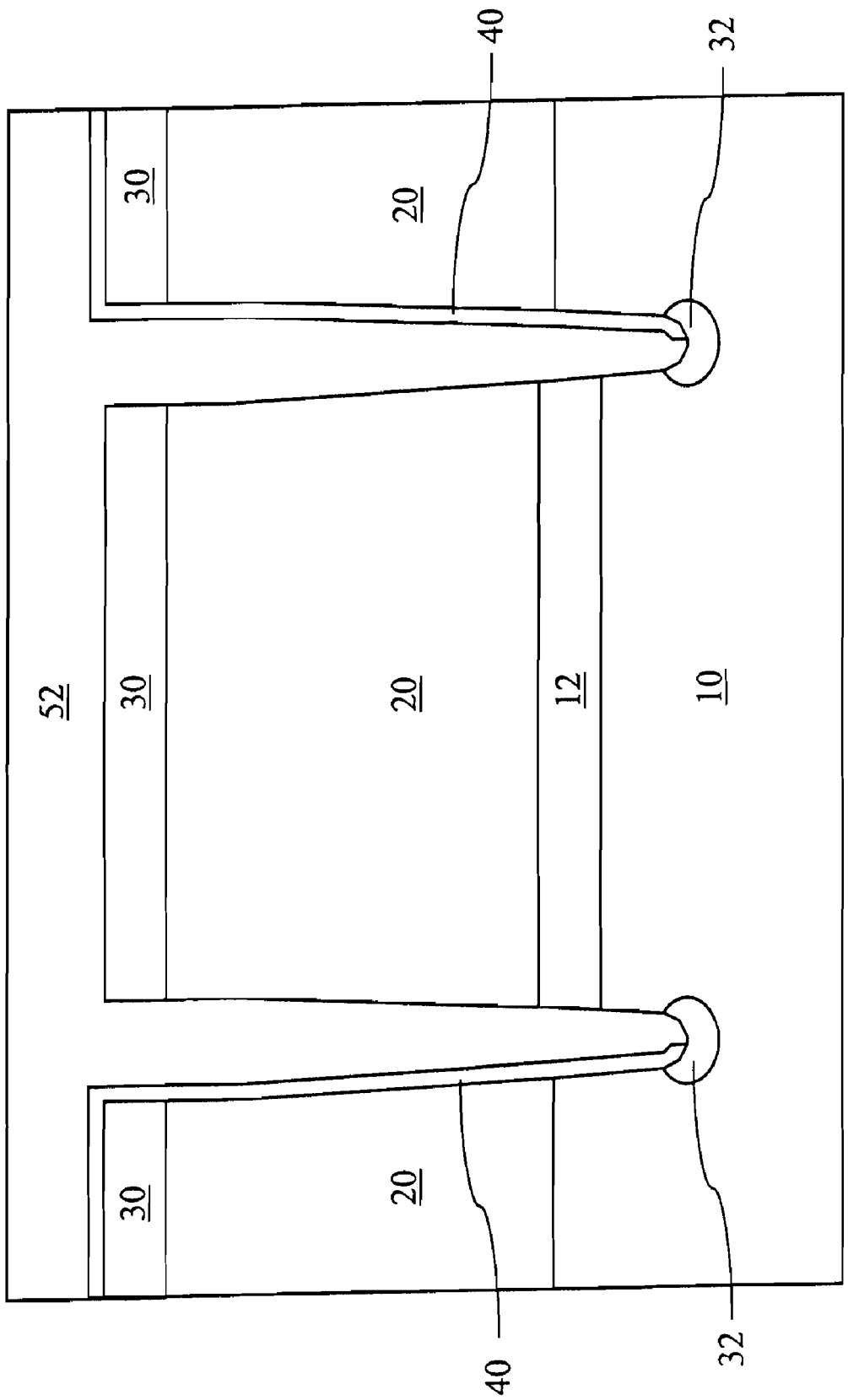

Referring to FIG. 13, the photoresist 41 is removed. A doped material layer 52 is deposited within the at least one deep trench 31 and fills the at least one deep trench 31 as shown in FIG. 13. The doped material layer 52 is a conductor. If the optional pad layer 30 is present, the doped material layer 52 is also deposited on the optional pad layer 30 as well. The dopants within the doped material layer 52 are of the same conductivity type as the dopants in the far subcollector 12. The doped material layer 52 may be selected from the group consisting of doped polysilicon, doped amorphous silicon, doped polycrystalline silicon containing alloy, and doped amorphous silicon containing alloy. Preferably, the doped material layer 52 has conformal step coverage and forms a minimal size seam at the center of the at least one deep trench 31.

Figure 14:
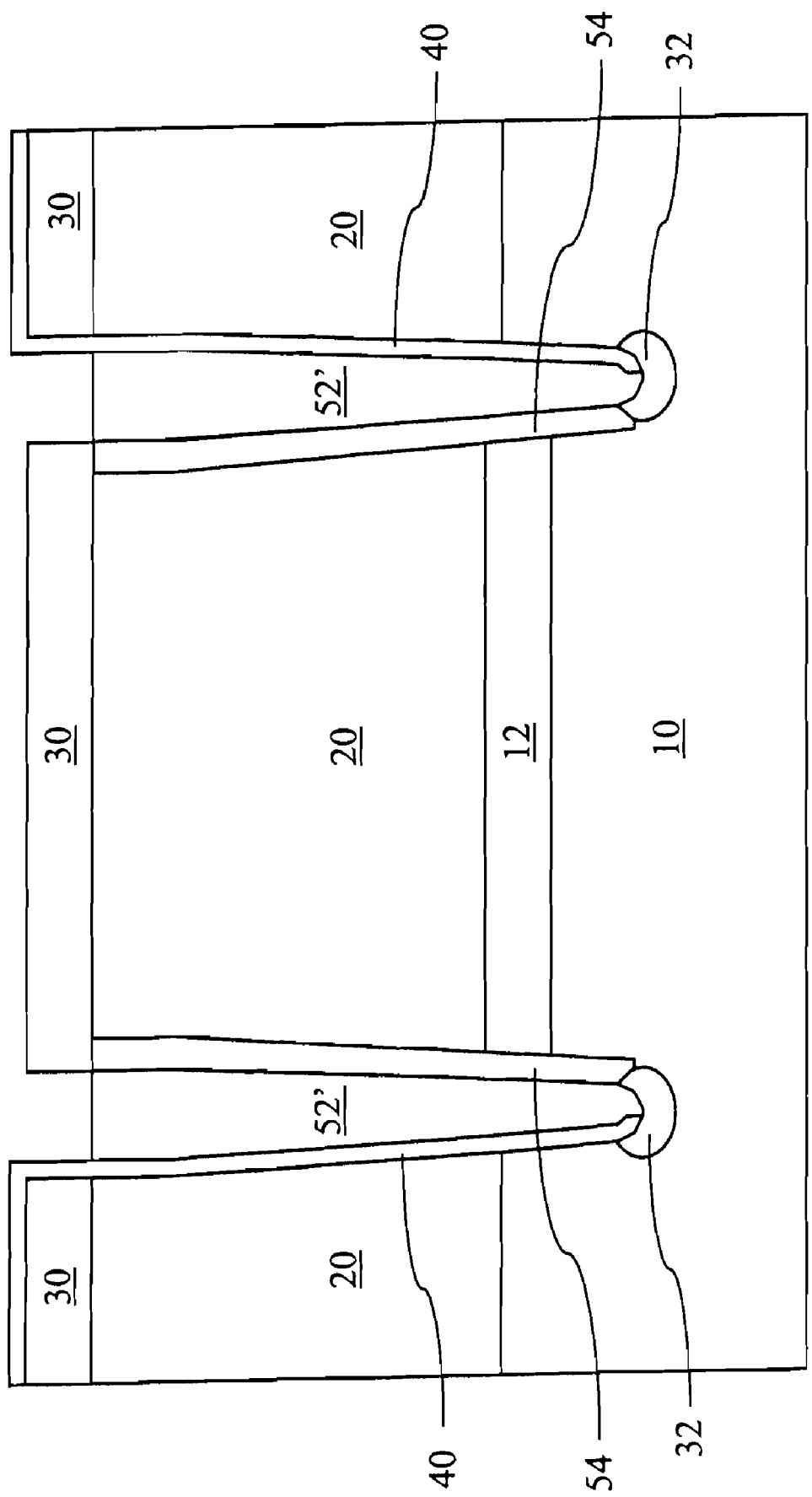

Referring to FIG. 14, the doped material layer 52 is either recessed by an etch, for example, a wet etch or a reactive ion etch (RIE), or planarized by chemical mechanical planarization (CMP) to form a doped fill material 52'. The dielectric layer 40 may be used as an etch stop layer or as a CMP stop layer. If the optional pad layer 30 is present, the optional pad layer 30 may also be used as an etch stop layer or as a CMP stop layer. A reactive ion etch may be employed to recesses the top of the doped fill material 52' below the top surface of the optional pad layer 30 as shown in FIG. 14.

A thermal anneal is performed to drive in the dopants from the doped material layer 52 into the semiconductor substrate 24 to form a reachthrough region 54. Since one side of the at least one deep trench 31 has the dielectric layer 40 that does not let dopants diffuse through, only the side of the at least one deep trench 31 without the dielectric layer 40 allows outdiffusion of dopants. Therefore, the reachthrough region 54 is formed only on one side of the at least one deep trench 31. Dopants within the reachthrough region 54 are of the same conductivity type as the dopants in the far subcollector 12, but are of the opposite conductivity type to the dopants in the guard ring region 32. The peak doping concentration within the reachthrough region 54 is in the range from about $1.0 \times 10^{19}/cm^3$ to about $1.0 \times 10^{21}/cm^3$, and preferably in the range from about $5.0 \times 10^{19}/cm^3$ to about $5.0 \times 10^{20}/cm^3$, with a gradual radial decrease in the doping concentration from the center of the at least one deep trench 31. Due to sufficiently high level of dopants in the guard ring region 32, the guard ring region 32 maintains the same conductivity type of doping after the drive-in anneal.

Therefore, the reachthrough region 54 according to the second embodiment of the present invention is formed only on one side of the at least one deep trench 31, and may have a shape of a partial tapered cylinder that is cleaved along the length of a cylinder, and may therefore be topologically homeomorphic to a sphere. While the description of the present invention refers to "a reachthrough region" 54, implementation of the present invention to multiple reachthrough regions 54 is straightforward and is herein explicitly contemplated. Multiple reachthrough regions 54 may be adjoined among themselves as needed.

Figure 15:
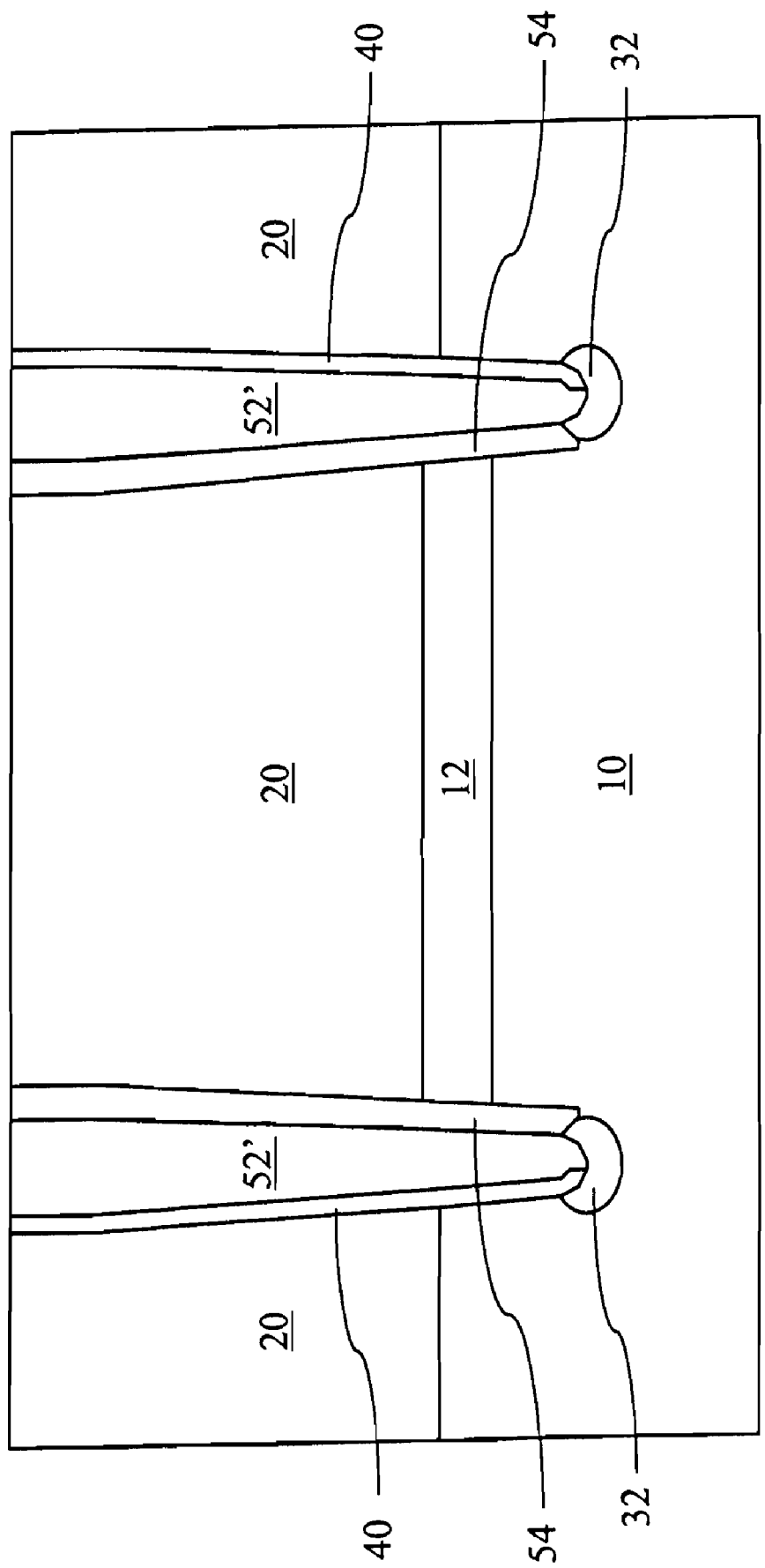

Referring to FIG. 15, the portion of the dielectric layer 40 above the top surface of the semiconductor substrate 24 and the optional pad layer 30 are removed by a reactive ion etch (RIE) or preferably by a wet etch.

Figure 16:
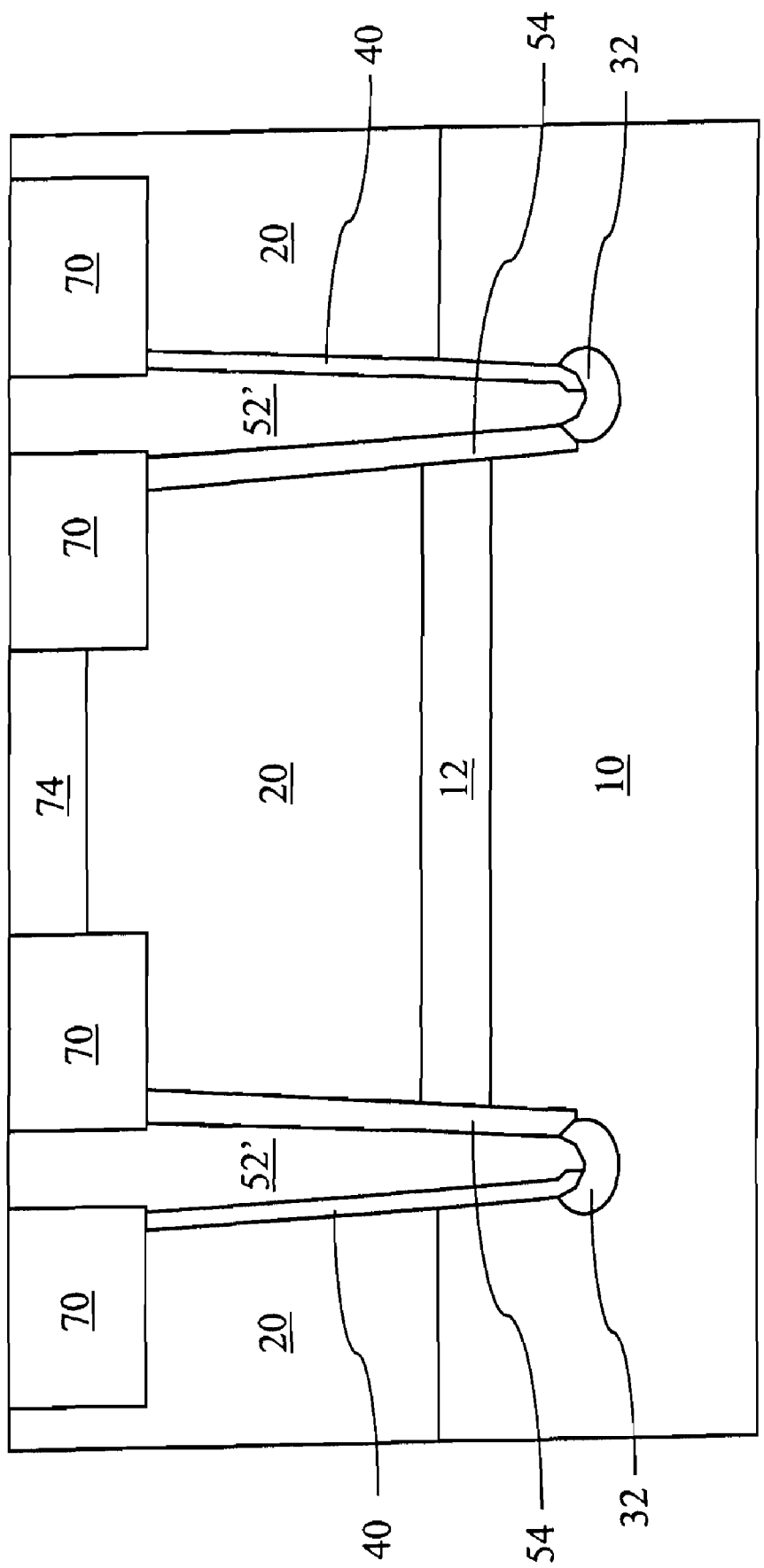

Referring to FIG. 16, shallow trench isolations 70 is formed by conventional methods, e.g., by application and lithographic patterning of a photoresist (not shown), etching shallow trenches in the semiconductor substrate 24, filling the shallow trenches with an insulator, and planarizing the top surface of the resulting semiconductor structure. Preferably, the shallow trench isolation 70 does not cover a portion of a top surface of the at least one deep trench 31 so that metal contacts may be subsequently formed thereupon.

Doped regions 74 other than the secondary reachthrough region 72 may also be formed at this point by suitable patterning of a photoresist and ion implantation. For example, if a doped region 74 is formed in an epitaxially grown semiconductor portion 20 surrounded by the at least one deep trenches 31 and has the opposite type of doping that the doping of the far subcollector 12, the overall structure forms a PIN diode.

Figure 17:
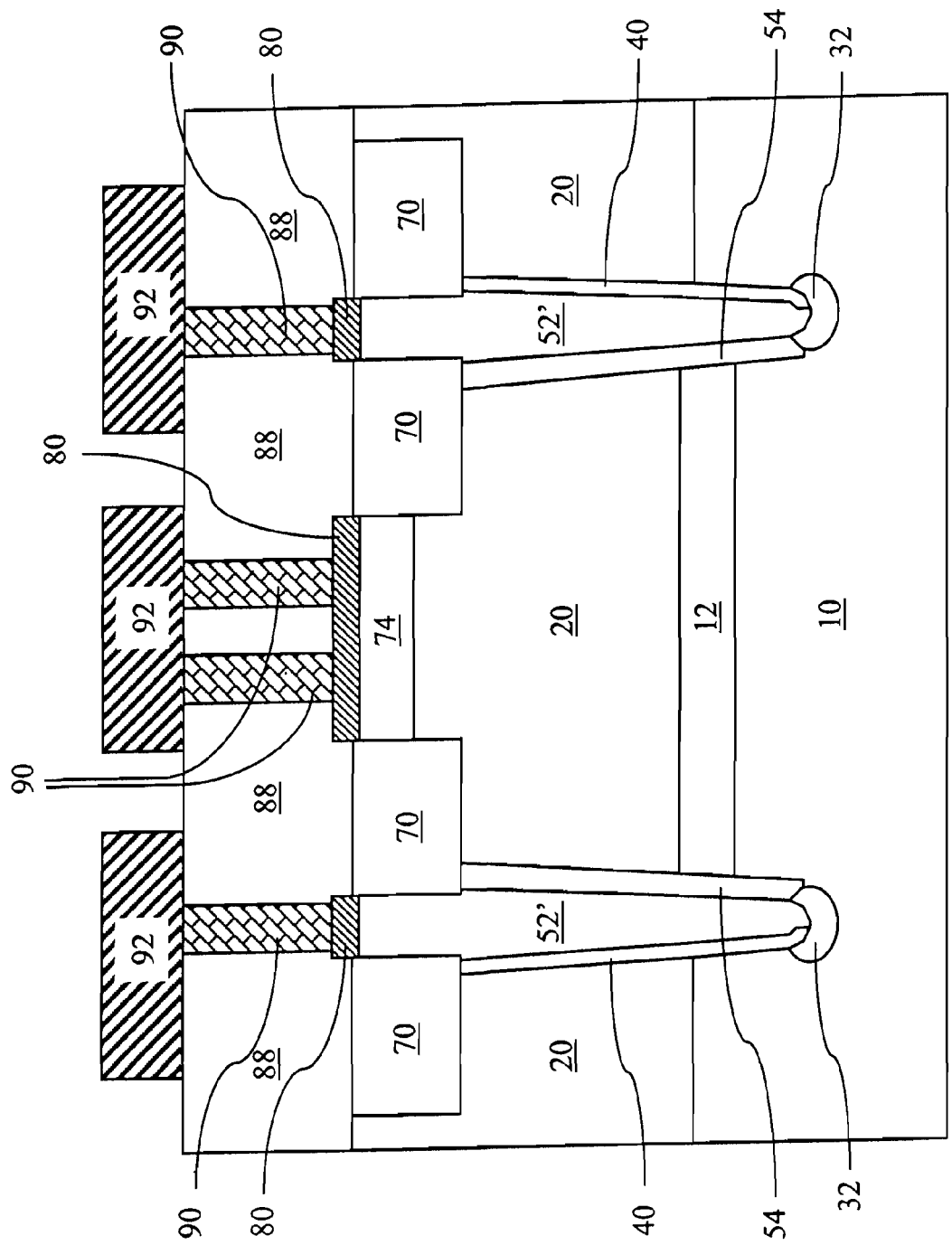

Referring to FIG. 17, a metal contact 80 is preferably formed on the doped fill material 52'. Metal contacts 80 may also be formed on other structures such as a doped region 74. Metal contacts may comprise a metal silicide. A middle-of-line (MOL) dielectric 88 is thereafter deposited and planarized followed by formation of contact via holes that are subsequently filled with contact vias 90. Metal wiring 92 is connected to the contact vias 90.

According to both embodiments of the present invention, a conductive path is formed from a far subcollector 12 that is preferably buried at a depth greater than projected ranges of conventional ion implantation through a reachthrough region (54 or 54') that contacts the far subcollector and optionally through secondary reachthrough region 72 to a metal contact 80 on the surface of a semiconductor substrate 24.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure, comprising:
   forming a far subcollector in a semiconductor substrate, wherein said far subcollector is doped with dopants of one conductivity type;
   forming at least one deep trench in said semiconductor substrate, wherein said at least one deep trench adjoins said far subcollector;
   depositing a dielectric layer on walls of said at least one deep trench;
   patterning said dielectric layer, wherein a portion of said dielectric layer is removed from inside said at least one deep trench to expose a sidewall of said at least one deep trench while another portion of said dielectric layer remains on another sidewall of said at least one deep trench;
   forming a reachthrough region on and outside a wall of said at least one deep trench and within said semiconductor substrate, wherein said reachthrough region is doped with dopants of said one conductivity type and abuts said far subcollector;

forming a doped fill material within said at least one deep trench and doped with dopants of said one conductivity type, wherein said doped fill material abuts said reachthrough region; and forming a metal contact directly on said doped fill material.

2. The method of claim 1, wherein said far subcollector in said semiconductor substrate is formed by ion implantation of a portion of an initial semiconductor substrate followed by an epitaxial growth of a semiconductor material on said initial semiconductor substrate.

3. The method of claim 1, further comprising forming a guard ring region directly beneath said at least one deep trench and doped with dopants of another conductivity type, wherein said another conductivity type is the opposite of said one conductivity type.

4. The method of claim 1, further comprising forming a dielectric layer located on and inside said wall of said at least one deep trench, wherein both said dielectric layer and said reachthrough region are topologically homeomorphic to a sphere.

5. The method of claim 1, further comprising:
depositing a doped material layer inside said at least one deep trench, wherein said doped material layer contains dopants of said one conductivity type;

driving in said dopants of said one conductivity type from said doped material layer into said semiconductor substrate.

6. The method of claim 1, further comprising:
depositing a doped material layer directly on a sidewall of said at least one deep trench, wherein a portion of said doped material layer becomes said doped fill material; and driving in dopants from said doped material layer into said sidewall of said at least one deep trench, wherein said reachthrough region is formed by doping a portion of said semiconductor substrate with said dopants.

7. The method of claim 1, wherein said reachthrough region is formed only on one side of said at least one deep trench but not on another side of said at least one deep trench.

8. The method of claim 1, wherein a conductive path is formed from said far subcollector through said reachthrough region and though said doped fill material to said metal contact.

9. The method of claim 4, further comprising:
lithographically patterning said dielectric layer; and
etching an exposed portion of said dielectric layer.

* * * * *